United States Patent
Huang et al.

(10) Patent No.: US 9,607,675 B1
(45) Date of Patent: Mar. 28, 2017

(54) READ/WRITE CONTROL DEVICE OF RESISTIVE TYPE MEMORY

(71) Applicant: Lyontek Inc., Hsinchu (TW)

(72) Inventors: Peng-Ju Huang, Miaoli County (TW); Ling-Yueh Chang, Hsinchu (TW)

(73) Assignee: LYONTEK INC., Hsinchu (TW)

( * ) Notice: Subject to any disclaimer, the term of this patent is extended or adjusted under 35 U.S.C. 154(b) by 0 days.

(21) Appl. No.: 15/256,208

(22) Filed: Sep. 2, 2016

(30) Foreign Application Priority Data

Jun. 7, 2016 (TW) .............................. 105117896 A

(51) Int. Cl.
*G11C 11/16* (2006.01)

(52) U.S. Cl.
CPC ........ *G11C 11/1673* (2013.01); *G11C 11/161* (2013.01); *G11C 11/1655* (2013.01); *G11C 11/1657* (2013.01); *G11C 11/1675* (2013.01)

(58) Field of Classification Search
None
See application file for complete search history.

(56) References Cited

U.S. PATENT DOCUMENTS

2016/0064059 A1* 3/2016 Takahashi ........... G11C 11/1675
365/158

* cited by examiner

*Primary Examiner* — James G Norman
(74) *Attorney, Agent, or Firm* — Chun-Ming Shih

(57) ABSTRACT

A read/write control device of resistive type memory includes a first logic unit and a second logic unit. In a bit line driving circuit, the first logic unit is connected to a gate of a first transistor set for outputting a bit line signal, wherein the first transistor set includes one PMOS and one NMOS serially connected to each other. The first logic unit has a pair of input terminals respectively for receiving a column selection signal and receiving a control signal that decides if data "0" is to be written. In a source line driving circuit, the second logic unit is connected to a gate of a second transistor set for outputting a source line signal, wherein the second transistor set includes one PMOS and one NMOS serially connected to each other. The second logic unit has a pair of input terminals respectively for receiving a column selection signal and receiving a control signal that decides if data "1" is to be written.

10 Claims, 7 Drawing Sheets

READ/WRITE CONTROL DEVICE OF RESISTIVE TYPE MEMORY

CROSS-REFERENCE TO RELATED APPLICATIONS

This application claims the priority of Republic of China Patent Application No. 105117896 filed on Jun. 7, 2016, in the State Intellectual Property Office of the R.O.C., the disclosure of which is incorporated herein by reference.

BACKGROUND OF THE INVENTION

Field of the Invention

The invention relates to fields of non-volatile memory, and more particularly, to a read/write control device of resistive type memory. The resistive type memory is a memory comprising elements that may change resistance characteristics thereof according to directional changes of currents flowing therethrough, such as magnetic random access memory (MRAM) or resistive random access memory (RRAM or ReRAM).

Descriptions of the Related Art

Resistive type memory is a non-volatile memory, which may store data through the use of its resistance characteristic. Particularly, MRAM is a resistive type memory, which is primarily composed of magnetic tunnel junction (MTJ) structures, using electron spin characteristic thereof and changes of magnetic orientations in free layers of magnetic structures to make resistance changes so as to record data "0" and "1".

A basic core memory bit cell of the above MRAM comprises one MTJ element and one switch transistor. The MTJ element acts as a variable resistance. This means, whether to write data "1" or "0" to the memory bit cell depends on a current flow direction through the MTJ element. For example, if the current flows from a bit line (BL) to a source line (SL), it would decrease the resistance of the MTJ element and thus data "0" is being written. If the current flows from SL to BL, it would increase the resistance of the MTJ element and thus data "1" is being written.

FIG. 1A is a schematic diagram showing the architecture of a conventional read/write circuit of resistive type memory. As shown in FIG. 1A, the circuit architecture comprises: an address decoder 11, a SL driving circuit 12, a BL driving circuit 13, and a read detection unit 14 having a current sense amplifier (SA), so as to perform read/write control on a memory bit cell on a particular row and a particular column of a memory bit cell array 10. The address decoder 11 outputs column selection signals CS0b-CSnb and CS0-CSn to a SL selection multiplexer set 140 and a BL selection multiplexer set 141 respectively, wherein each selection multiplexer of the SL selection multiplexer set 140 and BL selection multiplexer set 141 is composed of PMOS and NMOS connected in parallel to each other. The address decoder 11 controls which selection multiplexer and which word line to be turned on, so as to select a memory bit cell to perform read/write operations thereon. It should be noted that, in response to a voltage signal to be transmitted including high level signal (such as power signal VDD) and low level signal (such as ground signal GND), the multiplexer is, but not limited to, in the form of parallel-connected PMOS and NMOS as in FIG. 1A. However if the voltage signal to be transmitted is only required to be below VDD-Vth, the multiplexer may be composed of a single NMOS. Flexible configuration is allowed for the multiplexer according to the embodiment being chosen.

If it is to write data "0" to a particular memory bit cell being selected, a current flows from a power terminal (that is, power signal VDD) of the BL driving circuit 13 through a PMOS transistor of the BL driving circuit 13, then through a global BL and a certain selection multiplexer of the BL selection multiplexer set 141, then through the selected memory bit cell (selection can be made via word lines WL0-WLm outputted from a word line driving circuit 15 and the above column selection signals), then through a certain selection multiplexer of the SL selection multiplexer set 140, finally through a global SL to the SL driving circuit 12 where the current flows through a NMOS transistor to a ground terminal (that is, ground signal GND); this is a current path WP0 for writing data "0" as shown in FIG. 1A. On the other hand, if it is to write data "1" to a particular memory bit cell being selected, a current flows from a power terminal (that is, power signal VDD) of the SL driving circuit 12 through a PMOS transistor of the SL driving circuit 12, then through a certain selection multiplexer of the SL selection multiplexer set 140 and the selected memory bit cell, then through a certain selection multiplexer of the BL selection multiplexer set 141, finally to the BL driving circuit 13 where the current flows through a NMOS transistor to a ground terminal; this is a current path WP1 for writing data "1" as shown in FIG. 1B. Moreover, FIG. 1C shows a current path RP for performing a read operation on a memory bit cell located on a particular row and a particular column. If it is to read data stored in a particular memory bit cell, a SL connected to this memory bit cell should go through a certain selection multiplexer of the SL selection multiplexer set 140 to reach a global SL and then through a NMOS transistor to a ground terminal. And, a bit line connected to the memory bit cell should go through a certain selection multiplexer of the BL selection multiplexer set 141 to reach a global BL and then to be connected to an input terminal of SA. The current paths WP0 and WP1 from the power terminal to the ground terminal must at least pass through two PMOS transistors and two NMOS transistors. If the BL selection multiplexer set 141 and the SL selection multiplexer set 140 use more than two transistors to be connected in series, or the design of the SL driving circuit 12 and BL driving circuit 13 is more complicated, the current paths may need to pass through even more MOS transistors.

Take MRAM as an example, a write current for a MTJ element of size 100 nm is greater than 600 μA. The more transistors the current paths WP0 and WP1 pass through, the larger the size of each transistor must be in order to provide a required current strength. Particularly, if each multiplexer of the BL selection multiplexer set 141 is changed from having one transistor to two serially connected transistors, these two transistors must be each enlarged to be twice of its original size to have intact current drive capability. Such enlargement undesirably increases parasitic capacitance on the read/write paths and thus increases current consumption, thereby even reducing read/write speed of the memory.

Therefore, how to make a new read/write circuit of resistive type memory in order to solve the above problems of the conventional technology is an important topic in the art.

SUMMARY OF THE INVENTION

In view of the above drawbacks of the prior art, a primary object of the invention is to provide a read/write control device of resistive type memory, so as to reduce the number of transistors through which a current path passes during a data write operation, thereby effectively reducing power consumption and costs.

To achieve the above and other objects, a read/write control device of resistive type memory is provided in the invention. The read/write control device includes: an address decoder for outputting at least a column selection signal and at least a row selection signal; a word line driving circuit for switching and selecting a word line according to the row selection signal outputted from the address decoder, and outputting a word line signal; a bit line driving circuit for switching and selecting a bit line according to the column selection signal outputted from the address decoder, and outputting a bit line signal; the bit line driving circuit including: at least a first logic unit, at least a first transistor set including one PMOS transistor and one NMOS transistor serially connected to each other, and a guide transistor connected to a source of the NMOS transistor of the first transistor set, wherein the first logic unit has an output terminal connected to gates of the PMOS and NMOS transistors of the first transistor set, and the first logic unit further has a pair of input terminals respectively for receiving the column selection signal and for receiving a control signal for deciding if writing data "0" is performed, and wherein drains of the PMOS and NMOS transistors of the first transistor set are connected to each other to form the bit line; a source line driving circuit for switching and selecting a source line according to the column selection signal outputted from the address decoder, and outputting a source line signal; the source line driving circuit including: at least a second logic unit, and at least a second transistor set including one PMOS transistor and one NMOS transistor serially connected to each other, wherein the second logic unit has an output terminal connected to gates of the PMOS and NMOS transistors of the second transistor set, and the second logic unit further has a pair of input terminals respectively for receiving the column selection signal and for receiving a control signal for deciding if writing data "1" is performed, and drains of the PMOS and NMOS transistors of the second transistor set are connected to each other to form the source line; at least a memory bit cell including a variable resistance element and a third transistor serially connected to each other, wherein a source of the third transistor is connected to the source line, and the variable resistance element has an end connected to a drain of the third transistor and another end connected to the bit line, and wherein a gate of the third transistor is for receiving the word line signal outputted from the word line driving circuit; and a read detection unit having a sense amplifier, wherein an input terminal of the sense amplifier is connected to a global bit line of the bit line driving circuit. When the second logic unit receives a control signal that determines writing data "1" is to be performed and receives the column selection signal, the PMOS transistor of the second transistor set connected to the second logic unit is turned on, and when the first logic unit receives a control signal that determines writing data "0" is not to be performed and receives the column selection signal, the NMOS transistor of the first transistor set connected to the first logic unit is turned on, such that a write current path for writing data "1" goes from the turned-on PMOS transistor of the second transistor set, through a memory bit cell that is selected by the row selection signal of the address decoder, to the turned-on NMOS transistor of the first transistor set, then through the guide transistor to ground. Alternatively, when the first logic unit receives a control signal that determines writing data "0" is to be performed and receives the column selection signal, the PMOS transistor of the first transistor set connected to the first logic unit is turned on, and when the second logic unit receives a control signal that determines writing data "1" is not to be performed and receives the column selection signal, the NMOS transistor of the second transistor set connected to the second logic unit is turned on, such that a write current path for writing data "0" goes from the turned-on PMOS transistor of the first transistor set, through a memory bit cell that is selected by the row selection signal of the address decoder, to the turned-on NMOS transistor of the second transistor set and to ground. Alternatively, when the second logic unit receives the control signal that determines writing data "1" is not to be performed and receives the column selection signal, the NMOS transistor of the second transistor set connected to the second logic unit is turned on, and when the first logic unit receives the control signal that determines writing data "0" is not to be performed and receives the column selection signal, the NMOS transistor of the first transistor set connected to the first logic unit is turned on, such that a read current path goes from the global bit line connected to the input terminal of the sense amplifier, through the turned-on NMOS transistor of the first transistor set, through a memory bit cell that is selected by the row selection signal of the address decoder, to the turned-on NMOS transistor of the second transistor set and to ground.

In the read/write control device of resistive type memory of the invention, the first and second logic units are NOR gates. Further, the word line driving circuit, the bit line driving circuit and the source line driving circuit are controlled by the address decoder, wherein when the resistive type memory is standby, or the source line or bit line is not a source line or bit line being selected by the address decoder, the source line driving circuit or bit line driving circuit pre-charges the bit line and the source line respectively to the same electric potential as a power signal.

Moreover in the read/write control device of the invention, a bit line voltage at a control terminal of the bit line is controlled to be a predetermined voltage when reading data, and the predetermined voltage is 0.2V or smaller than 0.2V.

In another embodiment of the read/write control device of resistive type memory of the invention, the first and second logic units are NAND gates. When the resistive type memory is standby, or the source line or bit line is not a source line or bit line being selected by the address decoder, the source line driving circuit or bit line driving circuit pre-discharges the bit line and the source line respectively to the same electric potential as a ground signal.

Therefore, the read/write control device of resistive type memory of the invention allows currents to pass through less transistors to complete data writing operations, and before performing read/write operations the electric potential relationship between bit lines and source lines is considered such that stress due to voltage change at two ends of the variable resistance element of the memory bit cell would not be caused to the variable resistance element or error writing would not happen. Moreover in the invention, during read operations, bit lines are connected to a global bit line through the bit line driving circuit and to the input terminal of the current sense amplifier in the read detection unit, such that there is no need to provide additional bit line selection multiplexer set or source line selection multiplexer set for the read operations, and thereby design is simplified and layout complexity is reduced in the invention. The read/write control device of resistive type memory of the invention thus provides a low power consumption and low cost read/write architecture of resistive type memory.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1A:
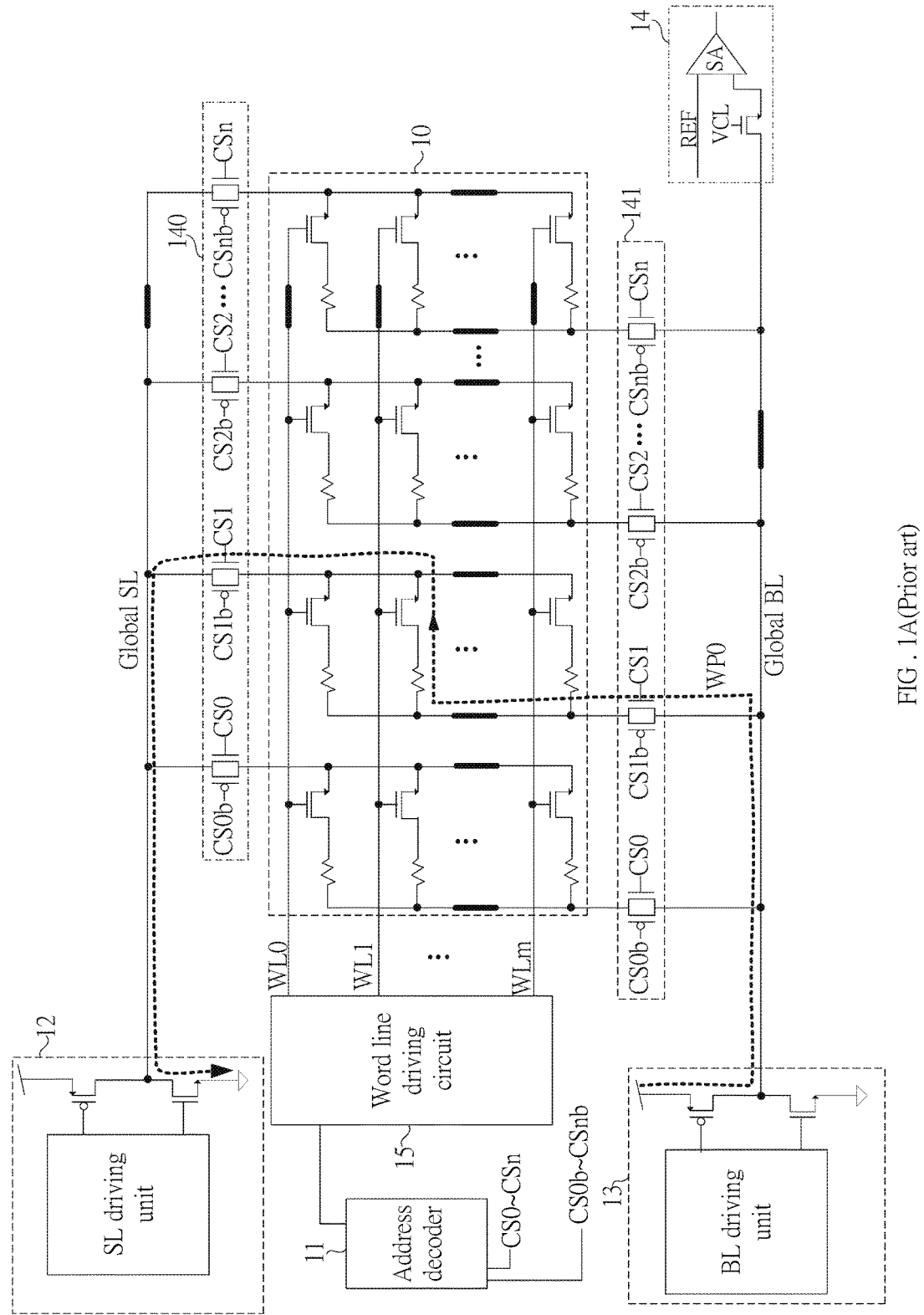
FIG. 1A is a schematic diagram showing a current path for an operation of writing data "0" in a conventional resistive type memory circuit architecture.

Embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

Figure 2A:
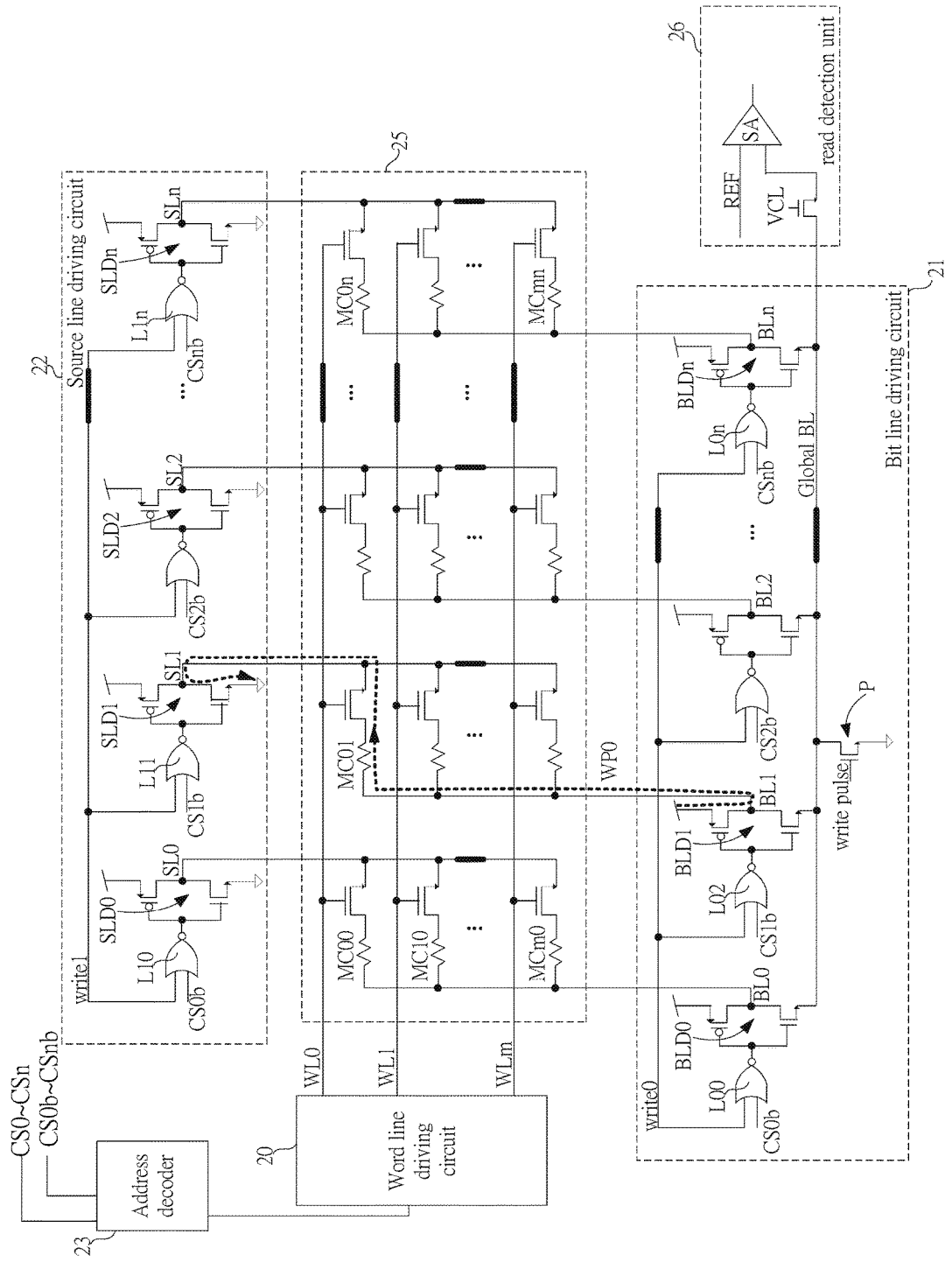
FIG. 2A is a schematic diagram showing a circuit architecture of an embodiment of a read/write control device of resistive type memory of the invention and a current path for an operation of writing data "0".
Figure 2B:
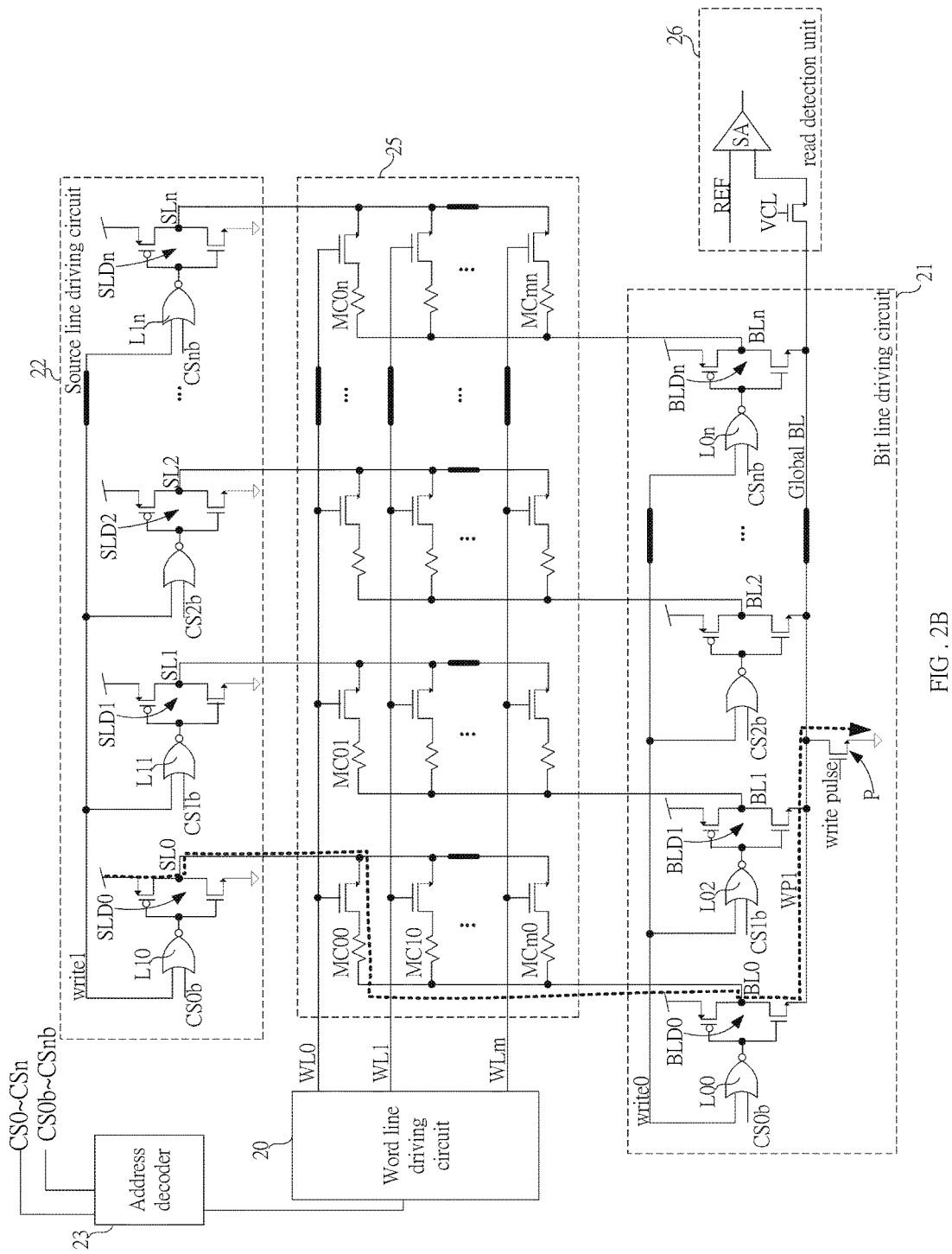
FIG. 2B is a schematic diagram showing the circuit architecture of the embodiment of the read/write control device of resistive type memory of the invention and a current path for an operation of writing data "1".
Figure 2C:
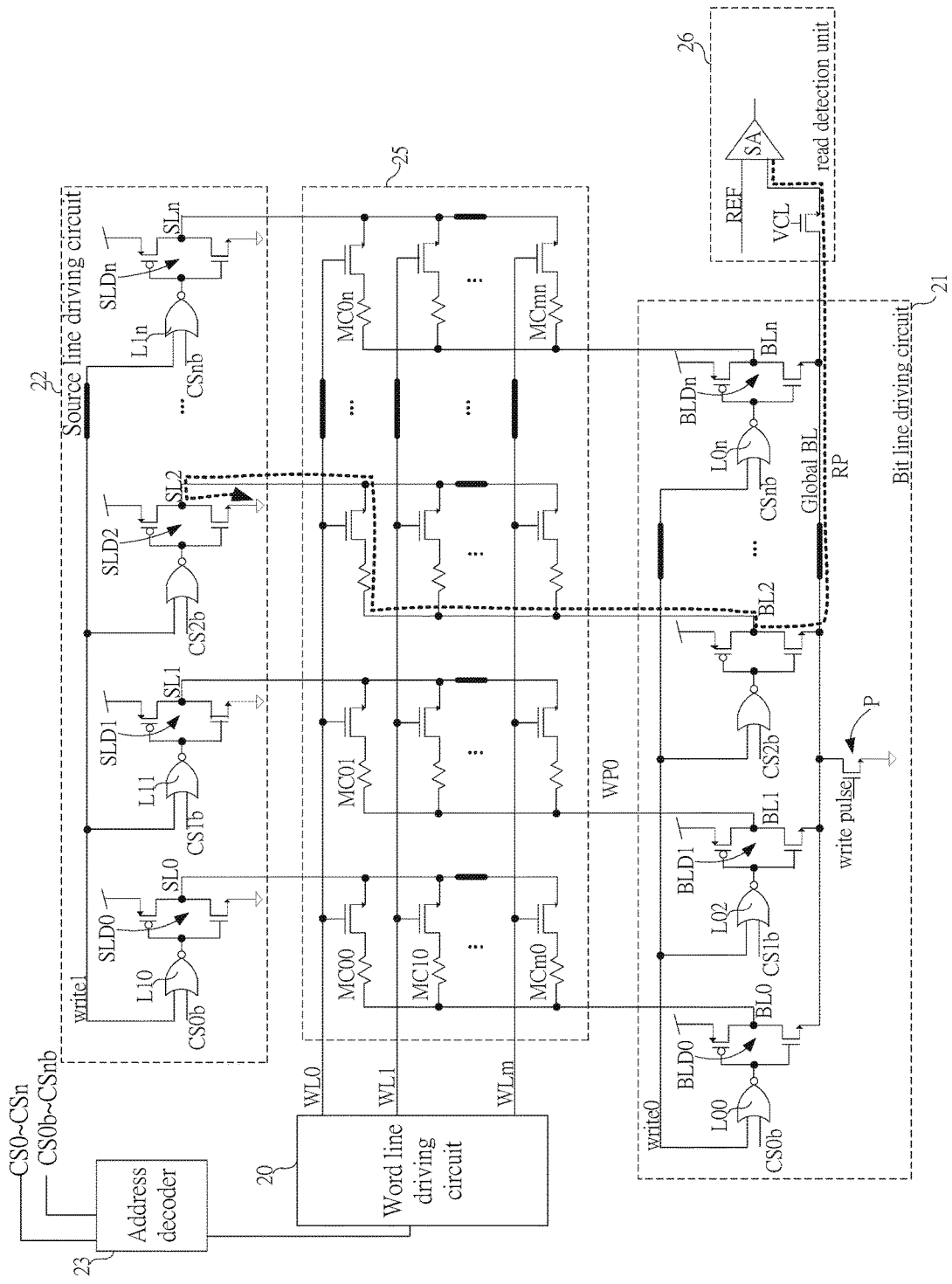
FIG. 2C is a schematic diagram showing the circuit architecture of the embodiment of the read/write control device of resistive type memory of the invention and a current path for a read operation.

FIGS. 2A-2C are schematic diagrams showing a circuit architecture of an embodiment of a read/write control device of resistive type memory of the invention. In this embodiment, the read/write control device of resistive type memory comprises: a word line (WL) driving circuit 20, a bit line (BL) driving circuit 21, a source line (SL) driving circuit 22, an address decoder 23, and a memory bit cell array 25 including a plurality of rows of memory bit cells and a plurality of columns of memory bit cells. Operations of the WL driving circuit 20, BL driving circuit 21 and SL driving circuit 22 are all controlled by the address decoder 23. As shown in the figures, input terminals of a plurality of first logic units L00, L01-L0n receive column selection signals CS0b-CSnb outputted from the address decoder 23 respectively, so as to output corresponding column selection signals for selecting a particular column of memory bit cells of the memory bit cell array 25 in order to perform read/write operations thereon. The WL driving circuit 20 provides a plurality of word lines WL0-WLm, allowing a particular word line to be selected therefrom according to row selection signals outputted from the address decoder 23, so as to perform read/write operations on a particular column of memory bit cells in the plurality of columns of memory bit cells.

The BL driving circuit 21 and the SL driving circuit 22 together act as a control unit for data writing. That is, the BL driving circuit 21 and the SL driving circuit 22 are used to control the current flow direction to be from bit lines to source lines, so as to write data "0" to a particular row of memory bit cells in the plurality of rows of memory bit cells. Alternatively, they control the current flow direction to be from source lines to bit lines, so as to write data "1" to a particular row of memory bit cells in the plurality of rows of memory bit cells. Moreover, also according to the word lines WL0-WLm provided by the WL driving circuit 20 and the column selection signals CS0b-CSnb outputted from the address decoder 23, they cooperate with the BL driving circuit 21 or the SL driving circuit 22 to decide whether to write data "0" or data "1" to a particular memory bit cell of the memory bit cell array 25.

The BL driving circuit 21 comprises: a plurality of first transistor sets BLD0-BLDn, wherein each first transistor set is composed of one PMOS transistor and one NMOS transistor connected serially to each other; and a plurality of first logic units L00, L01-L0n, wherein each of the first logic units L00, L01-L0n has an output terminal connected to gates of the PMOS and NMOS transistors of a corresponding one of the first transistor sets BLD0-BLDn. Each of the first logic units L00, L01-L0n further has a pair of input terminals respectively for receiving a corresponding column selection signal CS0b-CSnb and for receiving a control signal write0 to decide whether to write data "0". The serially connected PMOS and NMOS transistors of each of the first transistor sets BLD0-BLDn have their drains connected to each other and serve as a corresponding bit line BL0-BLn which may output a bit line signal according to the column selection signal CS0b-CSnb and the control signal write0 that decides whether data "0" is to be written.

The SL driving circuit 22 comprises: a plurality of second transistor sets SLD0-SLDn, wherein each second transistor set is composed of one PMOS transistor and one NMOS transistor connected serially to each other; and a plurality of second logic units L10, L11-L1n, wherein each of the second logic units L10, L11-L1n has an output terminal connected to gates of the PMOS and NMOS transistors of a corresponding one of the second transistor sets SLD0-SLDn. Each of the second logic units L10, L11-L1n further has a pair of input terminals respectively for receiving a corresponding column selection signals CS0b-CSnb and for receiving a control signal write1 to decide whether to write data "1". The serially connected PMOS and NMOS transistors of each of the second transistor sets SLD0-SLDn have their drains connected to each other and serve as a corresponding source line SL0-SLn which may output a source line signal according to the column selection signal CS0b-CSnb and the control signal write1 that decides whether data "1" is to be written.

Each of the memory bit cells MC00-MCmn of the memory bit cell array 25 is composed of a variable resistance element and a third transistor connected serially to each other. The third transistor has a drain connected to a corresponding one of the source lines SL0-SLn. The variable resistance element has an end connected to the drain of the third transistor and has an opposite end connected to a corresponding one of the bit lines BL0-BLn. A gate of the third transistor is connected to a corresponding one of the word lines WL0-WLm outputted from the WL driving circuit 20.

Figure 1B:
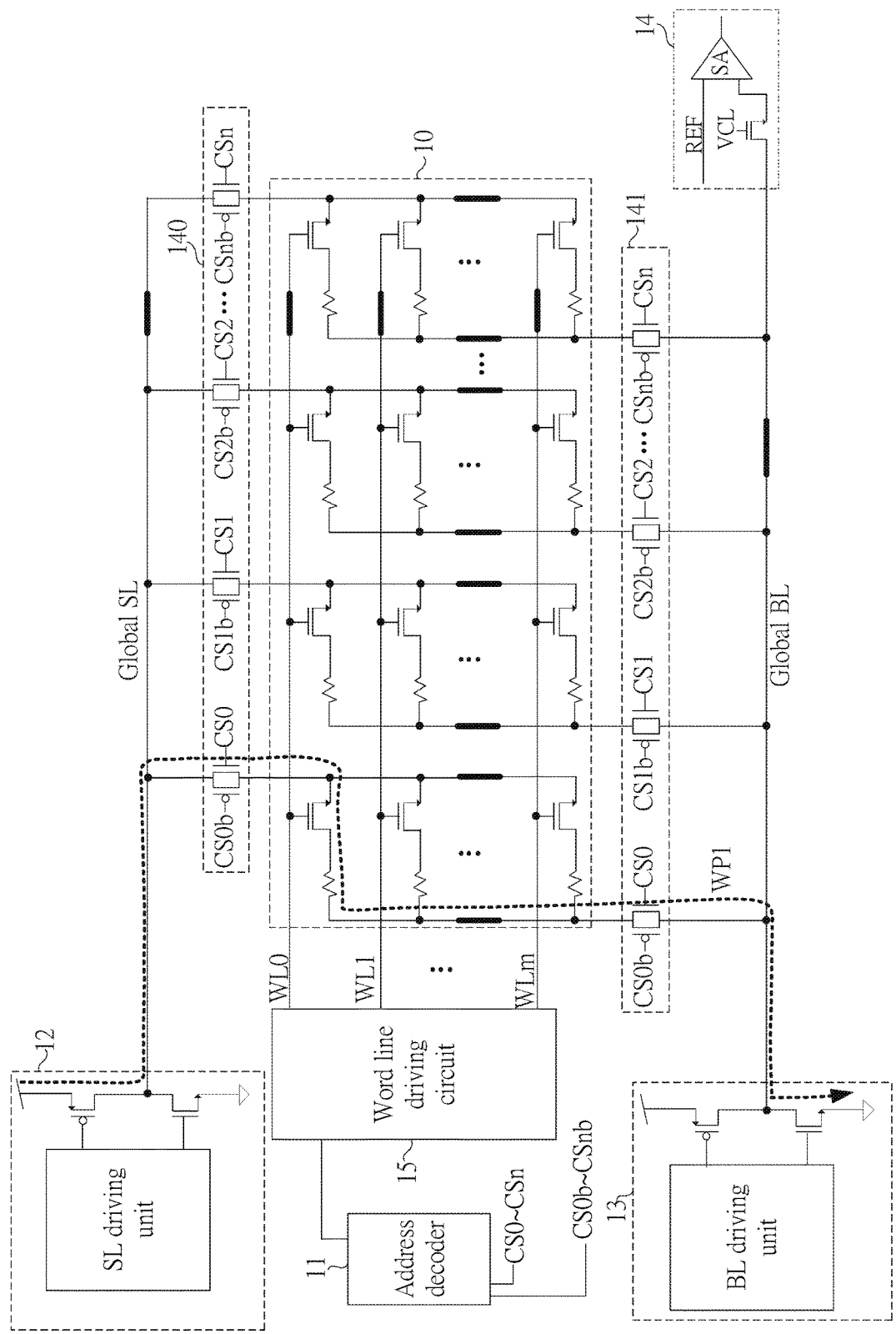
FIG. 1B is a schematic diagram showing a current path for an operation of writing data "1" in the conventional resistive type memory circuit architecture.
Figure 1C:
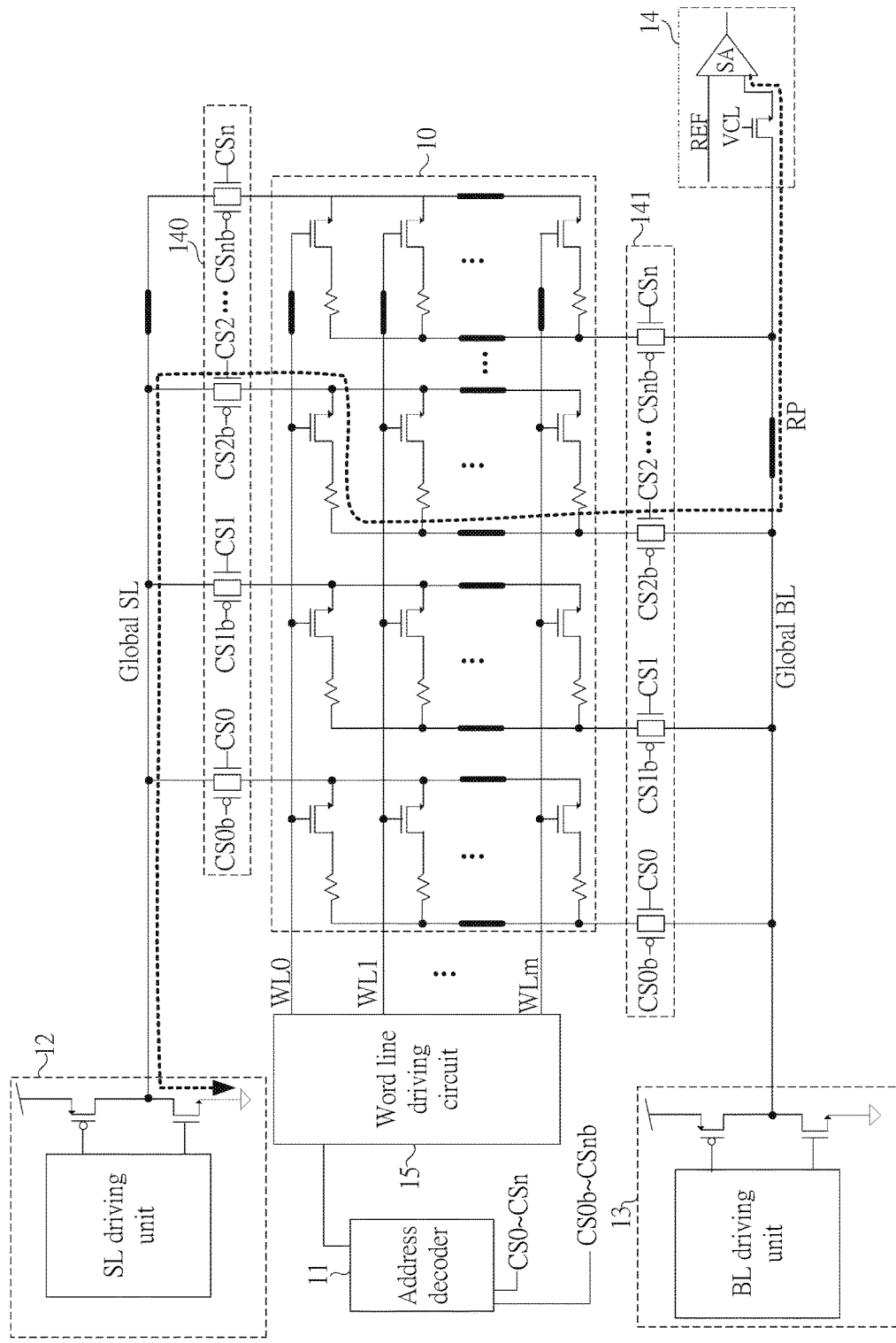
FIG. 1C is a schematic diagram showing a current path for a read operation in the conventional resistive type memory circuit architecture.

Referring to FIGS. 2A-2C, in this embodiment, according to a truth table shown in Table 1 below, the first logic units L00, L01-L0n and the second logic units L10, L11-L1n all use NOR gates. In order to reduce the number of transistors through which the write current passes, compared to the conventional circuit architecture (as shown in FIGS. 1A-1C), the invention integrates the BL selection multiplexer set 141 and the BL driving circuit 13 to form the BL driving circuit 21 shown in FIG. 2A, and integrates the SL driving circuit 12 and the SL selection multiplexer set 140 to form the SL driving circuit 22 shown in FIG. 2A. When the memory is standby, or a bit line (BL) or source line (SL) has not been selected yet, the BL and SL would be respectively pre-charged to the same electric potential as the power signal VDD. It should be noted that, the BL here refers to the bit lines BL0-BLn connected to the drains of PMOS and NMOS transistors of the first transistor sets BLD0-BLDn as shown in FIGS. 2A-2C, and the SL here refers to the source lines SL0-SLn connected to the drains of PMOS and NMOS transistors of the second transistor sets SLD0-SLDn. When it is to write data "0" to a memory bit cell, a current path WP0 for write signal "0" shown in FIG. 2A allows a current to flow from a power terminal VDD of the BL driving circuit 21, through a PMOS transistor and through a memory bit cell selected by the address decoder, to a NMOS transistor of the SL driving circuit 22 and to a ground terminal GND. This current path for writing data "0" only goes through one PMOS transistor and one NMOS transistor, thereby desirably reducing the number of transistors through which currents pass in the read/write control device of resistive type memory of the invention.

Moreover, when it is to write data "1" to a memory bit cell, a current path WP1 for write signal "1" shown in FIG. 2B allows a current to flow from a power terminal VDD of the SL driving circuit 22, through a PMOS transistor and through a memory bit cell selected by the address decoder, to a NMOS transistor of the BL driving circuit 21 and then to a global BL, and then through a NMOS guide transistor P (which is controlled by a write pulse signal) to a ground signal GND. This current path for writing data "1" only goes through one PMOS transistor and two NMOS transistors, thereby desirably reducing the number of transistors through which currents pass in the read/write control device of resistive type memory of the invention.

The current path WP1 has one more NMOS transistor than the current path WP0, which is the guide transistor P being turned on only at the time of writing data "1". This allows no additional circuit of selection multiplexer required for a current path RP for read operation. Particularly, in the read operation, the current path RP shown in FIG. 2C, a source line (one of SL0-SLn) being selected is drawn to a ground signal GND, and a bit line (one of BL0-BLn) being selected is coupled to an input terminal of SA. However, for the sake of saving power and reducing circuit space, normally multiple bit lines BL0-BLn correspond to one SA. That is, generally each of the bit lines BL0-BLn must go through the selection multiplexer to be connected to a global BL and then connected to SA (as shown in the current path RP in FIG. 1C). However, when the read operation is performed by the read/write device of the invention, each source line SL0-SLn when being selected can be drawn to have the electric potential of the ground signal GND by means of its corresponding circuit of the second transistor sets SLD0-SLDn; while for the bit lines BL0-BLn, a bit line (one of BL0-BLn) when being selected can be connected to the global BL first by its corresponding circuit of the first transistor sets BLD0-BLDn and then connected to SA where signal comparison is performed. Particularly, when the read/write device of the invention receives a control signal write0 (for determining writing data "0" to be performed) being in low level (that is, the read/write device is in a status of writing data "1" or reading), a BL signal of the selected bit line (one of BL0-BLn) is allowed to pass through a NMOS transistor of a corresponding first transistor set (one of BLD0-BLDn) to the global BL, wherein a gate of the NMOS transistor is connected to the output terminal of the corresponding first logic unit, and the NMOS transistor also has the function of selection multiplexer in the read operation as in the prior art. When the read/write device of the invention receives a control signal write1 (for determining writing data "1" to be performed) being in low level (that is, the read/write device is in a status of writing data "0" or reading), according to a second transistor set selected by the address decoder 23 from the second transistor sets SLD0-SLDn, the SL driving circuit 22 turns on a corresponding NMOS transistor and allows a selected source line to be drawn to the ground signal GND.

TABLE 1

|  | Write 0 | Write 1 | Read | Pre-charge (Standby/non-selected) |
|---|---|---|---|---|
| BL | VDD | GND | SA input | VDD |
| SL | GND | VDD | GND | VDD |

Therefore, compared to the conventional circuit architecture (as shown in FIGS. 1A-1C), the invention additionally provides a guide transistor P at a position close to ends of bit lines on the current path for writing data "1". Further in the invention, an input terminal of SA of a read detection unit 26 for performing the read operation is connected to a drain of each NMOS transistor of the first transistor sets BLD0-BLDn in the BL driving circuit 21, that is, connected to the global BL, thereby replacing the BL selection multiplexer set 141 and the BL driving circuit 13 in the prior art. There is no need to provide additional BL selection multiplexer set for the read operation, such that design is simplified and layout complexity is reduced in the invention.

Figure 3:
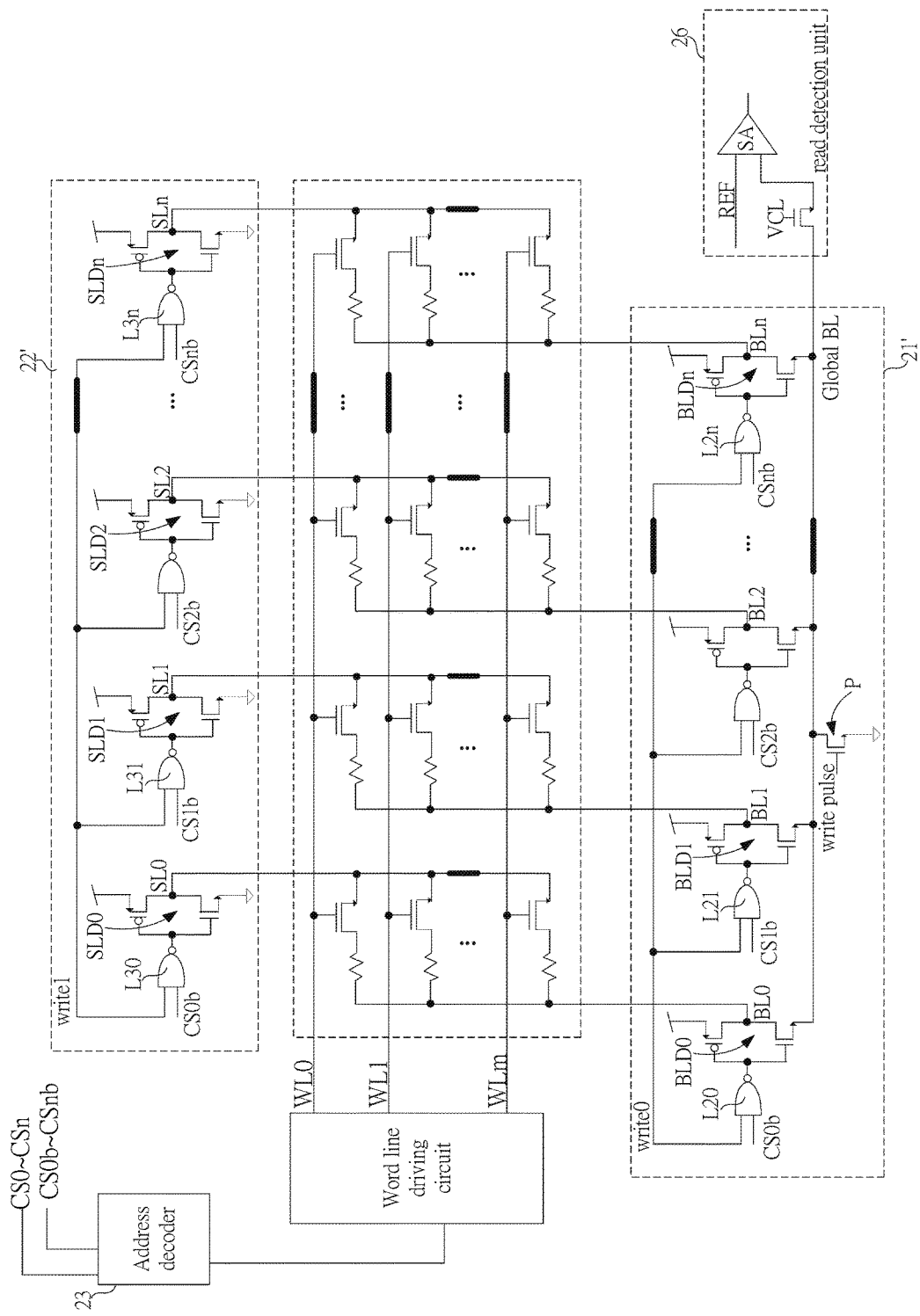
FIG. 3 is a schematic diagram showing a circuit architecture of another embodiment of the read/write control device of resistive type memory of the invention.

It should be noted that, the BL and SL are respectively pre-charged to the same electric potential as the power signal VDD as described above (which can also be discharged to the same electric potential as the ground signal GND as described in the embodiment of FIG. 3). In this case, the WL can be turned on, and the BL and SL of memory bit cells that are not selected on the same WL can be maintained at the same electric potential, such that stress due to voltage change at two ends of the variable resistance element would not be caused to the variable resistance element or error writing would not happen.

Moreover, referring to FIG. 3, which is a schematic diagram showing a circuit architecture of another embodiment of the read/write control device of resistive type memory of the invention, this embodiment is merely described in a way showing the differences from the above embodiment for the sake of simplicity. Compared to the embodiment shown in FIGS. 2A-2C, this embodiment differs in that, when the memory is standby, or the BL or SL has not yet been selected, provided that the BL and SL are respectively pre-discharged to the same electric potential as the ground signal GND, first logic units L20, L21-L2n and second logic units L30, L31-L3n all use NAND gates according to Table 2 below. When it is to write data "0" to a memory bit cell, a current flows from a power terminal VDD of a BL driving circuit 21', through a PMOS transistor and through a memory bit cell selected by the address decoder, to a NMOS transistor of a SL driving circuit 22' and to the ground signal GND. Such current path for writing data "0" only goes through one PMOS transistor and one NMOS transistor, thereby desirably reducing the number of transistors through which currents pass in the read/write control device of resistive type memory of the invention.

Alternatively, for the embodiment shown in FIG. 3, if it is to when it is to write data "1" to a memory bit cell, a current flows from a power terminal VDD of the SL driving circuit 22', through a PMOS transistor and through a memory bit cell selected by the address decoder, to a NMOS transistor of the BL driving circuit 21' and then to a global BL, and then through a NMOS guide transistor P to the ground signal GND. This current path for writing data "1" only goes through one PMOS transistor and two NMOS transistors, thereby desirably reducing the number of transistors through which currents pass in the read/write control device of resistive type memory of the invention.

TABLE 2

|    | Write 0 | Write 1 | Read     | Pre-charge (Standby/non-selected) |
|----|---------|---------|----------|-----------------------------------|
| BL | VDD     | GND     | SA input | GND                               |
| SL | GND     | VDD     | GND      | GND                               |

It should be noted that, in order to avoid writing errors or reliability issues during a read operation caused by over high voltage on a variable resistance element in each memory bit cell MC00-MCmn, in the above two embodiments, during the read operation as shown in Tables 1 and 2, the BL is connected to an input terminal of SA (SA input) and a bit line voltage VBL is controlled to be for example 0.2V or below. Generally, the read/write control device of resistive type memory further includes the read detection unit 26 and a voltage clamp circuit (not shown). The read detection unit 26 has a current sense amplifier (SA). The SA is used to compare currents IBL at bit line ends (such as BL control terminals BL0-BLn shown in FIGS. 2A-2C and 3) and a reference current IREF, and output the comparison results as logic signals 0 or 1 to a lower level. The reference current IREF may be generated by a reference current source or from a reference memory bit cell. For example, when the bit line current IBL is greater than the reference current IREF, the SA outputs a logic signal 0. On the contrary, when the bit line current IBL is smaller than the reference current IREF, the SA outputs a logic signal 1. By comparing the bit line current IBL (the larger the resistance of a variable resistance element, the smaller the bit line current IBL is; the smaller the resistance of a variable resistance element, the larger the bit line current IBL is) with the reference current IREF, when the variable resistance element of the memory bit cell has a relatively smaller resistance (for example, 1K ohm, which may mean data stored in the memory bit cell is "0"), SA compares the currents and knows the IBL current of the BL for the memory bit cell drawn down to the ground signal GND is greater than the reference current IREF, and thus determines that the data stored in the memory bit cell at the corresponding address is "0". When the variable resistance element of the memory bit cell has a relatively larger resistance (for example, 2K ohm, which may mean data stored in the memory bit cell is "1"), SA compares the currents and knows the IBL current of the BL for the memory bit cell drawn down to the ground signal GND is smaller than the reference current IREF, and thus determines that the data stored in the memory bit cell at the corresponding address is "1". As the comparison process provided by SA may increase the bit line voltage VBL, a voltage clamping method is used to control the voltage VBL. Thereby, as shown in FIGS. 2A-2C and 3, a NMOS transistor is added on a path from the global BL in the read detection unit 26 to SA, wherein a gate of the NMOS transistor is coupled to a clamping voltage VCL provide by the voltage clamp circuit. In the invention, the bit line voltage VBL is controlled to be for example 0.2V or below, so as to avoid writing errors for the variable resistance element and reliability issue of the element which might happen if the voltages at two ends of the variable resistance element exceed 0.2V during the read operation, such that a stable reading status is achieved by the NMOS transistor in the read detection unit 26.

The examples above are only illustrative to explain principles and effects of the invention, but not to limit the invention. It will be apparent to those skilled in the art that modifications and variations can be made without departing from the scope of the invention. Therefore, the protection range of the rights of the invention should be as defined by the appended claims.

What is claimed is:
1. A read/write control device of resistive type memory, including:
   an address decoder for outputting at least a row selection signal and at least a column selection signal;
   a word line driving circuit for switching and selecting a word line according to the row selection signal outputted from the address decoder, and outputting a word line signal;
   a bit line driving circuit for switching and selecting a bit line according to the column selection signal outputted from the address decoder, and outputting a bit line signal; the bit line driving circuit including: at least a first logic unit, at least a first transistor set including one PMOS transistor and one NMOS transistor serially connected to each other, and a guide transistor connected to a source of the NMOS transistor of the first transistor set, wherein the first logic unit has an output terminal connected to gates of the PMOS and NMOS transistors of the first transistor set, and the first logic unit further has a pair of input terminals respectively for receiving the column selection signal and for receiving a control signal for deciding if writing data "0" is performed, and wherein drains of the PMOS and NMOS transistors of the first transistor set are connected to each other to form the bit line;
   a source line driving circuit for switching and selecting a source line according to the column selection signal outputted from the address decoder, and outputting a source line signal; the source line driving circuit including: at least a second logic unit, and at least a second transistor set including one PMOS transistor and one NMOS transistor serially connected to each other, wherein the second logic unit has an output terminal connected to gates of the PMOS and NMOS transistors of the second transistor set, and the second logic unit further has a pair of input terminals respectively for receiving the column selection signal and for receiving a control signal for deciding if writing data "1" is performed, and drains of the PMOS and NMOS transistors of the second transistor set are connected to each other to form the source line;

at least a memory bit cell including a variable resistance element and a third transistor serially connected to each other, wherein a source of the third transistor is connected to the source line, and the variable resistance element has an end connected to a drain of the third transistor and another end connected to the bit line, and wherein a gate of the third transistor is for receiving the word line signal outputted from the word line driving circuit; and a read detection unit having a sense amplifier, wherein an input terminal of the sense amplifier is connected to a global bit line of the bit line driving circuit; when the second logic unit receives a control signal that determines writing data "1" is not to be performed and receives the column selection signal, and the first logic unit receives a control signal that determines writing data "0" is not to be performed and receives the column selection signal, a read current path goes from the global bit line connected to the input terminal of the sense amplifier, through one of the transistors of the first transistor set connected to the first logic unit that receives the column selection signal, through a memory bit cell that is selected by the address decoder, to one of the transistors of the second transistor set connected to the second logic unit that receives the column selection signal and to ground.

2. The read/write control device of resistive type memory according to claim 1, wherein when the second logic unit receives a control signal that determines writing data "1" is to be performed and receives the column selection signal, the PMOS transistor of the second transistor set connected to the second logic unit is turned on, and when the first logic unit receives the control signal that determines writing data "0" is not to be performed and receives the column selection signal, the NMOS transistor of the first transistor set connected to the first logic unit is turned on, such that a write current path for writing data "1" goes from the PMOS transistor of the second transistor set, through a memory bit cell that is selected by the row selection signal of the address decoder, to the NMOS transistor of the first transistor set connected to the first logic unit that receives the column selection signal, then through the guide transistor to ground.

3. The read/write control device of resistive type memory according to claim 2, wherein when the first logic unit receives a control signal that determines writing data "0" is to be performed and receives the column selection signal, the PMOS transistor of the first transistor set connected to the first logic unit is turned on, and when the second logic unit receives the control signal that determines writing "1" is not to be performed and receives the column selection signal, the NMOS transistor of the second transistor set connected to the second logic unit is turned on, such that a write current path for writing data "0" goes from the PMOS transistor of the first transistor set, through a memory bit cell that is selected by the row selection signal of the address decoder, to the NMOS transistor of the second transistor set connected to the second logic unit that receives the column selection signal and to ground.

4. The read/write control device of resistive type memory according to claim 1, wherein the read current path goes from the input terminal of the sense amplifier through the NMOS transistor of the first transistor set, through the memory bit cell that is selected by the row selection signal of the address decoder, to the NMOS transistor of the second transistor set and to the ground.

5. The read/write control device of resistive type memory according to claim 1, wherein the first and second logic units are NOR gates.

6. The read/write control device of resistive type memory according to claim 5, wherein the word line driving circuit, the bit line driving circuit and the source line driving circuit are controlled by the address decoder, wherein when the resistive type memory is standby, or the source line or the bit line is not selected by the address decoder, the bit line and the source line are respectively pre-charged to the same electric potential as a power signal.

7. The read/write control device of resistive type memory according to claim 6, wherein a bit line voltage at a control terminal of the bit line is controlled to be a predetermined voltage when reading data, and the predetermined voltage is 0.2V or smaller than 0.2V.

8. The read/write control device of resistive type memory according to claim 1, wherein the first and second logic units are NAND gates.

9. The read/write control device of resistive type memory according to claim 8, wherein the word line driving circuit, the bit line driving circuit and the source line driving circuit are controlled by the address decoder, wherein when the resistive type memory is standby, or the source line or the bit line is not selected by the address decoder, the bit line and the source line are respectively pre-discharged to the same electric potential as a ground signal.

10. The read/write control device of resistive type memory according to claim 9, wherein a bit line voltage of the bit line is controlled to be a predetermined voltage when reading data, and the predetermined voltage is 0.2V or smaller than 0.2V.

* * * * *